United States Patent
Liu et al.

(10) Patent No.: US 9,548,278 B1
(45) Date of Patent: Jan. 17, 2017

(54) METHODS AND APPARATUS FOR PASSIVE EQUALIZATION IN HIGH-SPEED AND HIGH DENSITY INTEGRATED CIRCUITS

(71) Applicant: Altera Corporation, San Jose, CA (US)

(72) Inventors: Jian Liu, Cupertino, CA (US); Hui Liu, Dublin, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 14/980,894

(22) Filed: Dec. 28, 2015

(51) Int. Cl.
*H01L 29/40* (2006.01)
*H01P 3/08* (2006.01)
*H01P 11/00* (2006.01)
*H01L 23/66* (2006.01)

(52) U.S. Cl.
CPC ....... *H01L 23/66* (2013.01); *H01L 2223/6616* (2013.01); *H01L 2223/6638* (2013.01); *H01L 2223/6672* (2013.01)

(58) Field of Classification Search
CPC ............ H01L 23/66; H01L 2223/6638; H01L 2223/6672; H01L 2223/6616
USPC ........................................................ 257/664
See application file for complete search history.

(56) References Cited

U.S. PATENT DOCUMENTS

| | | | |
|---|---|---|---|
| 7,924,113 B2 | 4/2011 | Chou | |
| 8,324,982 B2 | 12/2012 | Chou et al. | |
| 8,558,636 B2 | 10/2013 | Shin et al. | |
| 8,860,527 B2 | 10/2014 | Muraoka | |
| 9,373,600 B2 * | 6/2016 | Wen | H01L 24/17 |
| 2014/0184350 A1 * | 7/2014 | Howard | H01P 3/026 333/5 |
| 2014/0266516 A1 | 9/2014 | Xiao et al. | |

* cited by examiner

*Primary Examiner* — Caleen Sullivan

(57) ABSTRACT

A passive equalization structure is provided. The passive equalization structure includes a semiconductor substrate having first and a differential pair having first and second signal conductors. The first signal conductor is formed in a first layer of the semiconductor substrate. The second signal conductor is formed in a second layer in the semiconductor substrate that is different than the first layer. The passive equalization structure further includes first and second reference planes, whereby the first and second signal conductors are formed between the first and second reference planes. The first reference plane has a first thickness, and the first signal conductor has a second thickness that is different than the first thickness. A conductive via may short the first and second reference to minimize uncertainty and variations in capacitance from the first and second signal conductors and unwanted stray capacitance effects.

17 Claims, 10 Drawing Sheets

METHODS AND APPARATUS FOR PASSIVE EQUALIZATION IN HIGH-SPEED AND HIGH DENSITY INTEGRATED CIRCUITS

BACKGROUND

Transmission links such as circuit traces, integrated circuit interconnect lines or pins, backplanes, wires or cables, antennas, air, or other transmission media may attenuate, delay, or otherwise change the characteristics of signals traveling through them. Signal attenuation may be frequency dependent; different frequency signal components can be attenuated by different amounts. In general, high-frequency signal components are attenuated more than lower frequency components. Phase delay or group delay caused by the transmission link may also be frequency dependent, causing different signal frequency components to arrive at the receiver or transceiver with different delays.

In a dielectric stack such as those commonly used in backplanes, transmission losses may be due to skin effect and dielectric losses. Skin effect losses may lead to intersymbol interference (ISI), which results in an increased bit error rate (BER). In some integrated circuit devices, active equalization circuits may be provided to improve signal transmission. An active equalization circuit may amplify higher frequency components more than lower frequency components to compensate for bandwidth loss. However, such an equalization technique is fairly complex as it needs to be accompanied by a decision feedback equalization (DFE) circuit, which typically uses feedback to reduce the ISI in a presently transmitted signal. In addition, the use of an active equalization circuit increases cost and power consumption for the receiver or transceiver.

SUMMARY

In accordance with the present invention, methods and apparatus for passive equalization in high-speed and high density integrated circuits are provided.

It is appreciated that the present invention can be implemented in numerous ways, such as a process, an apparatus, a system, or a device. Several inventive embodiments of the present invention are described below.

A passive equalization structure is provided. The passive equalization structure includes a semiconductor substrate, a first signal conductor in a differential pair that forms in a first layer in the semiconductor structure, and a second signal conductor in the differential pair that is formed in a second layer in the semiconductor substrate that is different than the first layer. The passive equalization structure further includes first and second reference planes, whereby the first and second signal conductors are formed between the first and second reference planes. A conductive via may short the first and second reference planes.

An integrated circuit package is provided. The integrated circuit package includes a package substrate, and an integrated circuit mounted on the package substrate, whereby the package substrate includes a passive equalization structure that is connected to the integrated circuit. The passive equalization structure includes a reference plane, a first signal conductor that is formed at a first distance from the reference plane, and a second signal conductor that is formed at a second distance from the reference. The first and second distances are different. The passive equalization structure further includes an additional reference plane, whereby the first and second signal conductors are located between the first reference plane and the additional reference plane.

A passive equalization circuit is provided. The passive equalization circuit includes a substrate. A reference plane and a signal conductor are formed in the substrate. The reference plane has a first thickness and the signal conductor has a second thickness that is smaller than the first thickness. The passive equalization circuit further includes another signal conductor having the second thickness, whereby the signal conductor and the another signal conductor collectively serve as a differential signal pair. The reference plane is formed in a first layer in the substrate, the signal conductor is formed in a second layer in the substrate that is different than the first layer, and the another signal conductor is formed in a third layer in the substrate that is different than the first and second layers.

Further features of the invention, its nature and various advantages, will be more apparent from the accompanying drawings and the following detailed description of the preferred embodiments.

DETAILED DESCRIPTION

The embodiments provided herein include methods and apparatus for passive equalization high speed and high density integrated circuits.

It will be obvious, however, to one skilled in the art, that the present exemplary embodiments may be practiced without some or all of these specific details described with reference to the respective embodiments. In other instances, well-known operations have not been described in detail in order not to unnecessarily obscure the present embodiments.

Figure 1:
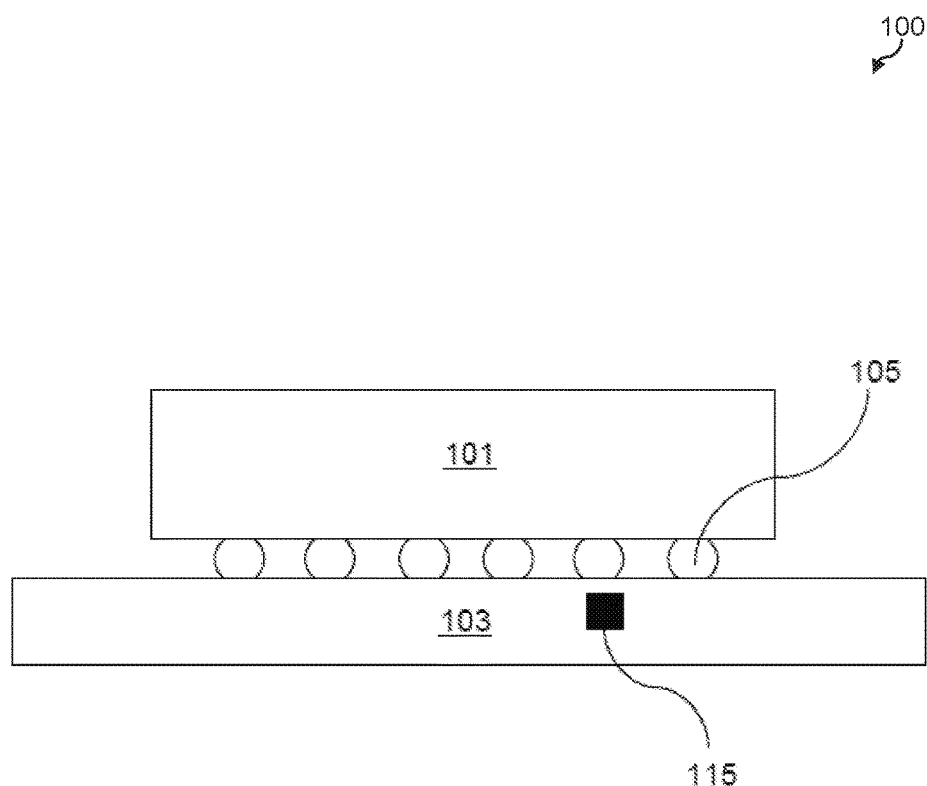
FIG. 1 shows an illustrative integrated circuit package in accordance with an embodiment.

FIG. 1 shows an illustrative integrated circuit package 100 in accordance with an embodiment of the present invention. Integrated circuit package 100 includes integrated circuit die 101 and semiconductor substrate 103. Integrated circuit die 101 is supported by semiconductor substrate 103 and is otherwise packaged within integrated circuit package 100. In one embodiment, semiconductor substrate 103 may be a package substrate. In other embodiments, semiconductor substrate 103 may be a printed circuit substrate.

In one embodiment, a passive equalization structure 115 may be embedded within semiconductor substrate 103 of integrated circuit package 100 and is electrically coupled to integrated circuit die 101 via micro bumps 105. For example, passive equalization structure 115 embedded within semiconductor substrate 103 may be electrically coupled to the TX (Transmitter) or RX (Receiver) portion of integrated circuit die 101. In one aspect, such a passive equalization structure may correct the frequency dependent loss of the transmission signal in integrated circuit package 100 such that the amount of energy lost from the transmission signal is over a frequency range of interest. A more detailed description of the passive equalization structure 115 will be described below with reference to FIGS. 2, 3A, 3B, and 4.

Figure 2:
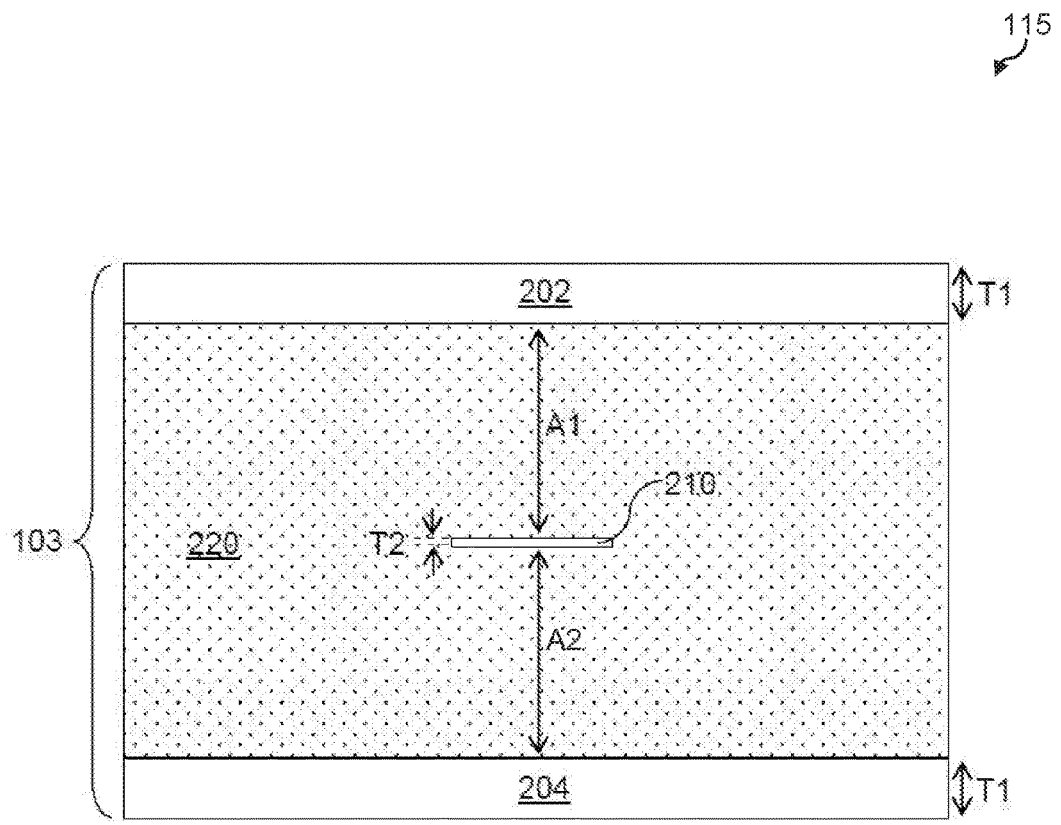
FIG. 2 shows an illustrative passive equalization circuit embedded in a semiconductor substrate in accordance with an embodiment.

FIG. 2 shows an illustrative passive equalization circuit 115 of FIG. 1 embedded in semiconductor substrate 103 in accordance with an embodiment of the present invention. Passive equalization circuit 115 may include reference planes 202 and 204, and signal conductor 210. Reference planes 202 and 204 may be power reference planes or ground reference planes for signal conductor 210. As shown in FIG. 2, signal conductor 210 is located between reference planes 202 and 204. Signal conductor 210 is located a distance A1 below reference plane 204. Similarly, signal conductor 210 is located a distance A2 above reference plane 204. In one embodiment, distance A1 and distance A2 may be equal or different from each other. As an example, each distance A1 and A2 may be about 22 μm. In one embodiment, signal conductor 210 is configured to communicate signals across semiconductor substrate 103 of FIG. 1. In some embodiments, signal conductor 210 is configured to communicate signals across circuit boards. Signal conductor 210 may be disposed in a dielectric material (not shown).

Each of reference planes 202 and 204 has a thickness T1, whereas signal conductor 210 has a thickness T2 that is different than thickness T1. In the exemplary embodiment, thickness T2 may be smaller than thickness T1 by at least two times, five times, or ten times. For example, thickness T1 may be about 15 micrometer (μm), and thickness T2 may be about 2 μm. Due to the thin nature of signal conductor 210, the current distribution in signal conductor 210 can be easily filled up during high-frequency signal transmission, which may mitigate skin-effect-induced dispersion problems.

Figure 3A:
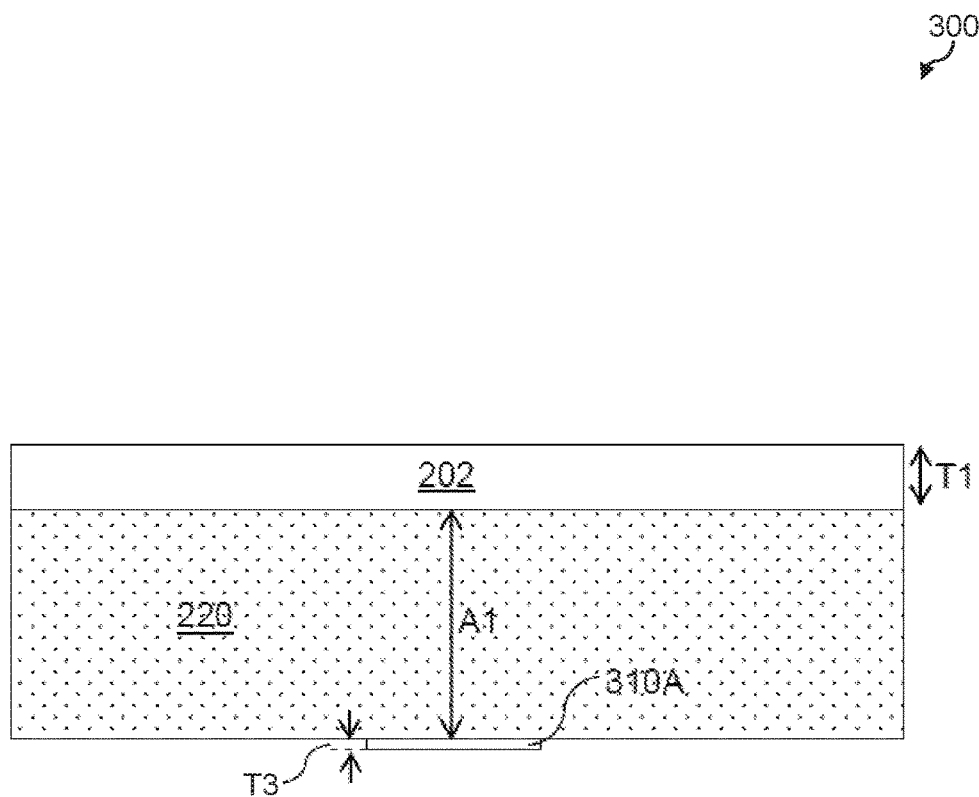
FIG. 3A shows an illustrative microstrip-type passive equalization circuit in accordance with an embodiment.
Figure 3B:
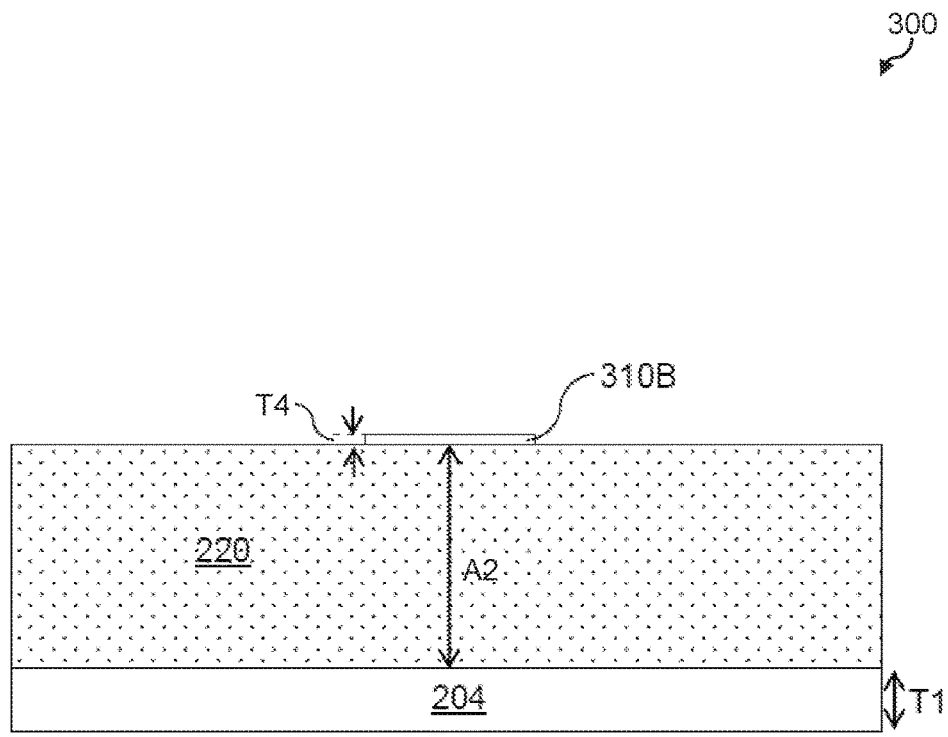
FIG. 3B shows another illustrative microstrip-type equalization circuit in accordance with an embodiment.

Passive equalization circuits in the form of microstrip lines may also be used to perform equalizing operations (i.e., matching of transmission signals). FIGS. 3A and 3B show different microstrip-type passive equalization circuits in accordance with an embodiment of the present invention. In FIG. 3A, microstrip-type passive equalization circuit 300 includes signal conductor 310A having a thickness T2, which is disposed over a bottom surface of dielectric material 220. A top surface of dielectric material 220 is coated with a conducting or metallized material to form conductive reference plane 202 (or reference plane 202). Signal conductor 310A is located a distance A1 below reference plane 202. Distance A1 may be about, for example, 22 μm.

In FIG. 3B, microstrip-type passive equalization circuit 350 includes signal conductor 310B having a thickness T2, which is disposed over a top surface of dielectric material 220. A bottom surface of dielectric material 220 is coated with additional conducting or metallized material to form conductive reference plane 204 (or reference plane 204).

Signal conductor 310B is located a distance A2 above reference plane 204. Distance A2 may be about, for example, 22 μm.

Similar to signal conductor 210 of FIG. 2, each of signal conductors 310A and 310B has a thickness (e.g., thickness T3 and T4) that is smaller than thickness T1 of the respective reference planes 202 and 204 by at least two times, five times, or ten times. In one embodiment, thickness T3 and T4 may be equal or different from each other. For example, thickness T1 may be about 15 micrometer (μm), and thickness T3 and T4 may be about 2 μm. The thin nature of signal conductors 310A and 310B allows current distribution in signal conductors 310A and 310B to be easily filled up during high-frequency signal transmission. Such a configuration may alleviate skin-effect-induced dispersion and transmission line losses in the microstrip lines.

Figure 4:
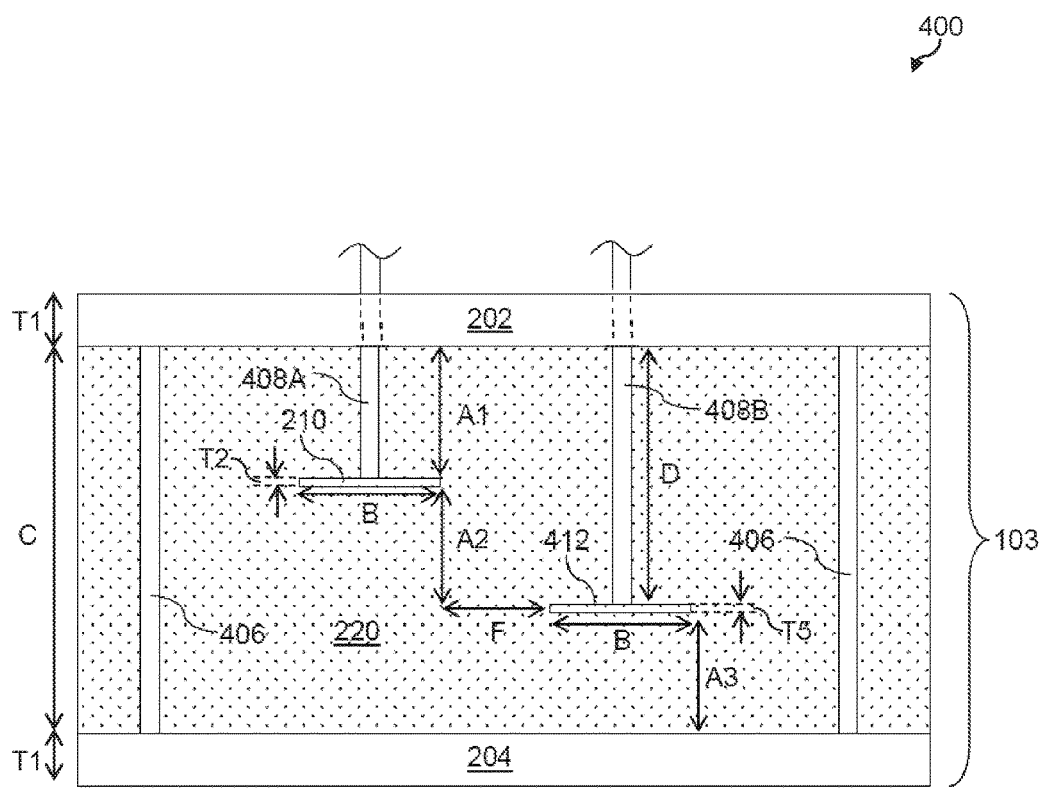
FIG. 4 shows an illustrative passive equalization structure embedded in a semiconductor substrate in accordance with an embodiment.

FIG. 4 shows an illustrative passive equalization structure 400 embedded in semiconductor substrate 103 in accordance with an embodiment of the present invention. Passive equalization structure 400 may be embedded within semiconductor substrate 103 of integrated circuit package 100 of FIG. 1. As shown in FIG. 4, passive equalization structure 400 includes reference planes 202 and 204 (also referred to as power supply planes or ground planes 202 and 204) and a pair of signal conductors 210 and 412 that are formed between reference planes 202 and 204. The pair of signal conductors 210 and 412 may carry differential signals from an integrated circuit die (e.g., integrated circuit die 101 of FIG. 1) through conductive vias 408A and 408B. Dielectric material 220 may be interposed between reference planes 202 and 204 and signal conductors 210 and 412. The distance C between reference planes 202 and 204 may be, for example, about 70 μm.

Reference planes 202 and 204 may have a thickness T1. Each of signal conductors 210 and 412 may have thickness T2 and T5 that is different than thickness T1. In one embodiment, thickness T2 and T5 may be equal or different from each other. In yet another embodiment, thickness T2 and T3 may be smaller than thickness T1 by at least two times, five times, or ten times. For example, thickness T1 of reference planes 202 and 204 may be about 15 micrometer (μm), and thickness T2 and T5 of signal conductors 210 and 412 may be about 2 μm. Due to the thin nature of signal conductors 210 and 412, current distribution in signal conductors 210 and 412 can be easily filled up during high frequency transmission, which may mitigate skin-effect induced dispersion.

In one embodiment, signal conductor 210 of width B may be vertically offset a distance A1 from reference plane 202 in a first layer in semiconductor substrate 103. For example, width B may be about 20 μm. Further, in the same embodiment, signal conductor 412 of width B may be vertically offset a distance D from reference plane 202. For example, distance D may be about 46 μm. Signal conductor 412 may also be horizontally offset a distance A2 from signal conductor 210 and a distance A3 from reference plane 204 in a second layer in semiconductor substrate 103. Distance A1, A2, and A3 may be equal or different from each other. For example, each distance A1, A2, and A3 may be about 22 μm. In yet another aspect of the same embodiment, signal conductor 412 may be horizontally offset a distance F from signal conductor 210 to maintain the differential pair density so as to support high bandwidth signal transmission. For instance, distance F may be about 8 μm.

Passive equalization structure 400 may also include conductive vias 406 coupled between reference planes 202 and 204. Conductive vias 406 may act as a shielding structure to minimize uncertainty and variations in capacitance from signal conductors 210 and 412 and unwanted stray capacitance effects (e.g., noises, cross talks). For example, conductive vias 406 may be ground conductive vias or power source conductive vias.

Figure 5:
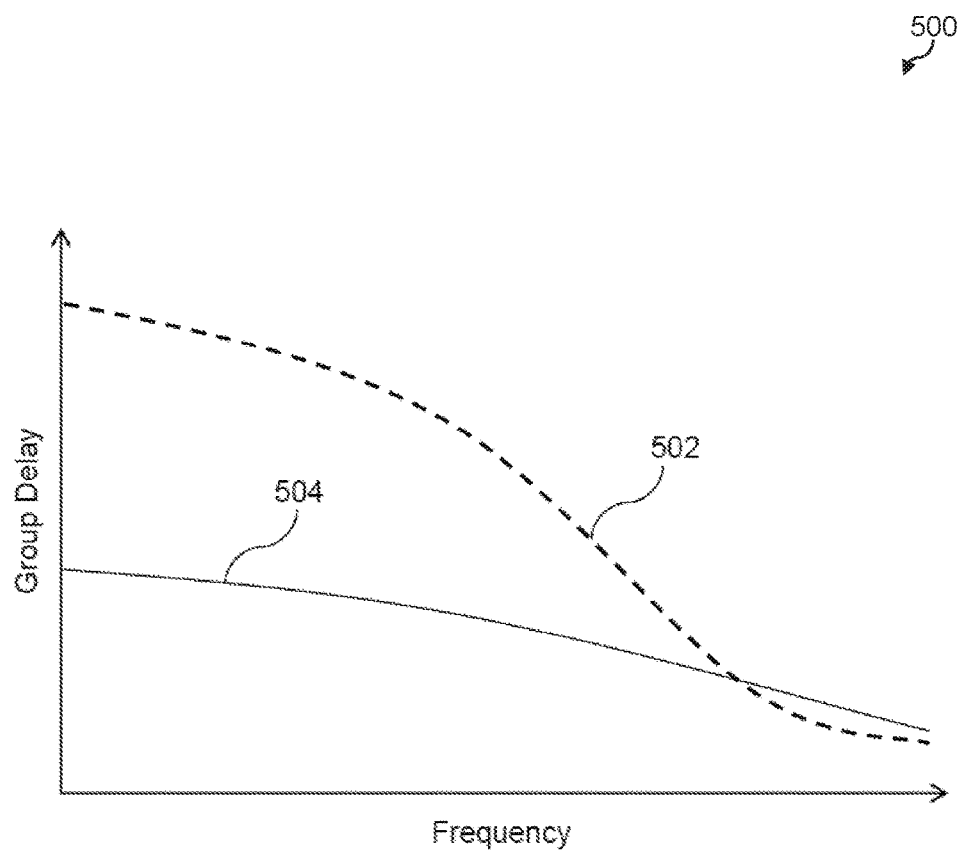
FIG. 5 shows a graph with a comparison of group delays of a signal transmission line in a semiconductor substrate in accordance with an embodiment.

FIG. 5 shows graph 500 with a comparison of group delays of a signal transmission line in a semiconductor substrate in accordance with an embodiment of the present invention. As shown, dashed curve line 502 may illustrate a group delay (or propagation delay) of a signal transmission channel in the semiconductor substrate (e.g., semiconductor substrate 103 of FIG. 1) without a passive equalization circuit. Accordingly, solid curve line 504 may illustrate another group delay of the signal transmission channel in the semiconductor substrate having a passive equalization circuit (e.g., package equalization circuits 115, 301, 311, and 400 of FIGS. 2, 3A, 3B, and 4).

As frequency increases, solid curve line 504 becomes substantially flatter compared to the dashed curve line 502. This means that the integration of the passive equalization circuit may minimize delay dispersion during signal transmission in the semiconductor substrate as the passive equalization circuit tends to reduce noise (e.g., jitter noise) associated with the frequency-modulated transmission signals that travel through the signal transmission channel.

Figure 6:
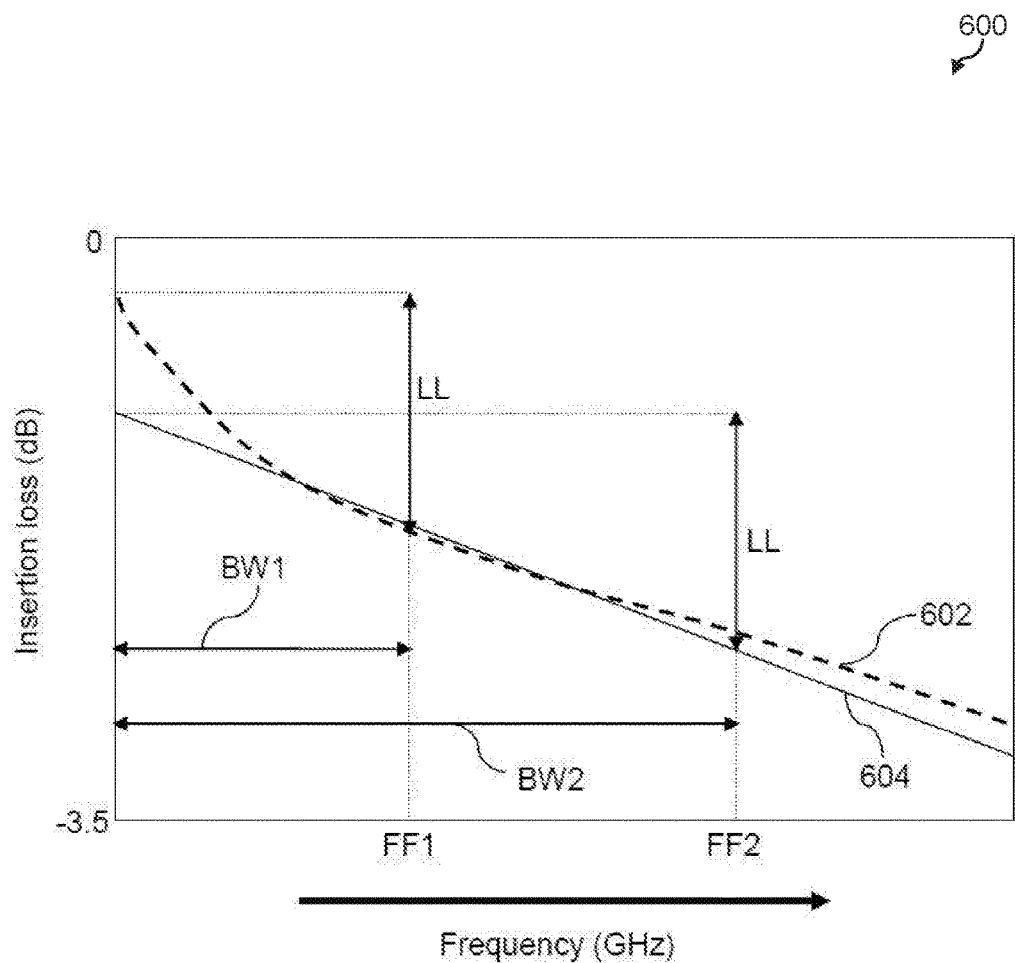
FIG. 6 shows a graph with a comparison of bandwidth rates of a signal transmission line in a semiconductor substrate in accordance with an embodiment.

FIG. 6 shows graph 600 with a comparison of bandwidth rates of a signal transmission line in a semiconductor substrate in accordance with an embodiment of the present invention. As shown, dashed curve line 602 may illustrate insertion loss versus frequency curve for a signal transmission channel in a semiconductor substrate (e.g., semiconductor substrate 103 of FIG. 1) without a passive equalization circuit. Accordingly, solid curve line 604 may illustrate insertion loss versus frequency for the signal transmission channel in a semiconductor substrate having a passive equalization circuit (e.g., package equalization circuits 115, 301, 311, and 400 of FIGS. 2, 3A, 3B, and 4).

The integration of the passive equalization circuit may improve insertion loss in the semiconductor substrate, which may consequently improve bandwidth as the frequency increases. For example, the semiconductor substrate without the passive equalization circuit may yield a narrower bandwidth (e.g., BW1) and a lower frequency (e.g., FF1) at an insertion loss of LL, as indicated by dashed curve line 602. On the other hand, the semiconductor substrate with the passive equalization circuit may yield a wider bandwidth (e.g., BW2) at a higher frequency (e.g., FF2) at the same insertion loss of LL, as indicated by solid curve line 604.

Figure 7A:
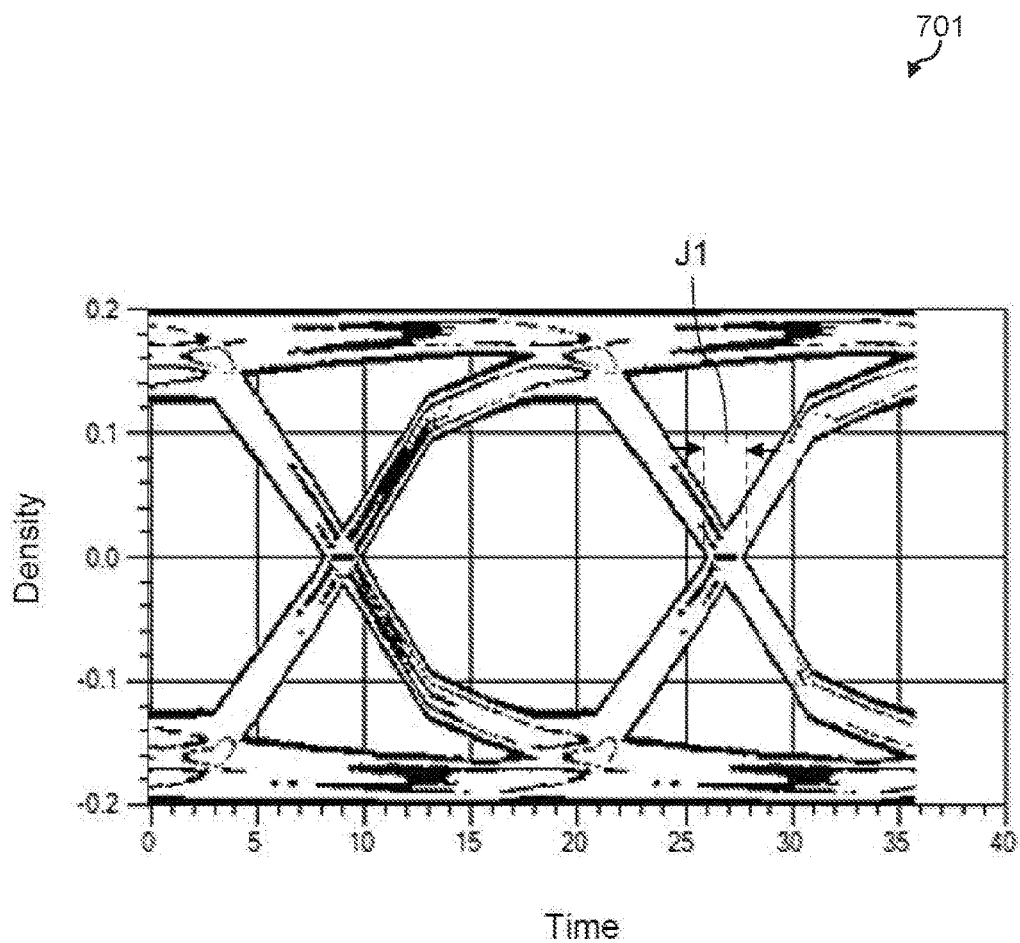
FIGS. 7A and 7B are eye diagrams of a signal transmission channel in a semiconductor substrate with and without equalization in place in accordance with an embodiment.
Figure 7B:
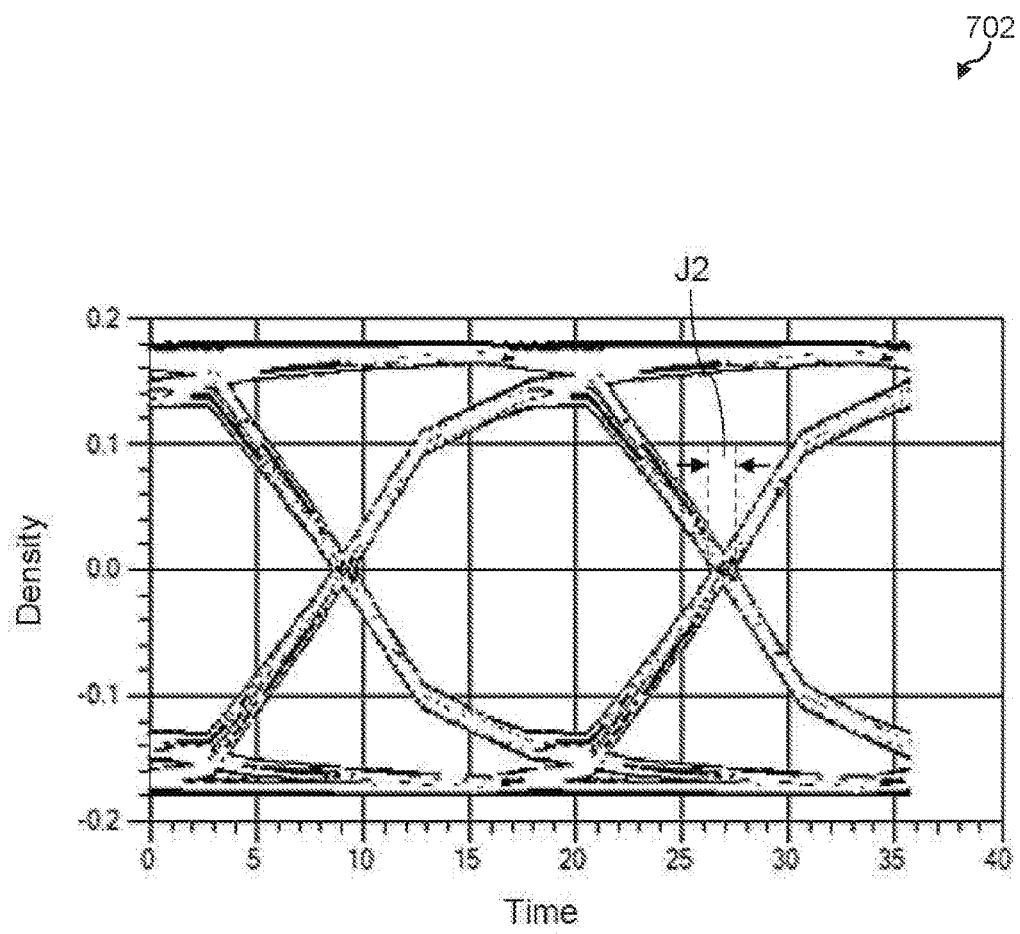

FIGS. 7A and 7B show eye diagrams 701 and 702 of a signal transmission channel in a semiconductor substrate (e.g., semiconductor substrate 103 of FIG. 1) with and without equalization in place. Eye diagram 701 of the signal transmission in a semiconductor substrate without equalization portrays a small eye opening and a substantially high voltage jitter (e.g., J1) in the superimposed signal transitions. In contrast to eye diagram 701, eye diagram 702 of the signal transmission in a semiconductor substrate with equalization portrays a large eye opening in eye diagram 702 and a substantially low voltage jitter (e.g., J2) in the superimposed signal transitions. The reduced level of voltage jitter is a result from the integration of a passive equalization circuit (e.g., package equalization circuits 115, 301, 311, and 400 of FIGS. 2, 3A, 3B, and 4) in semiconductor substrate 103.

Figure 8:
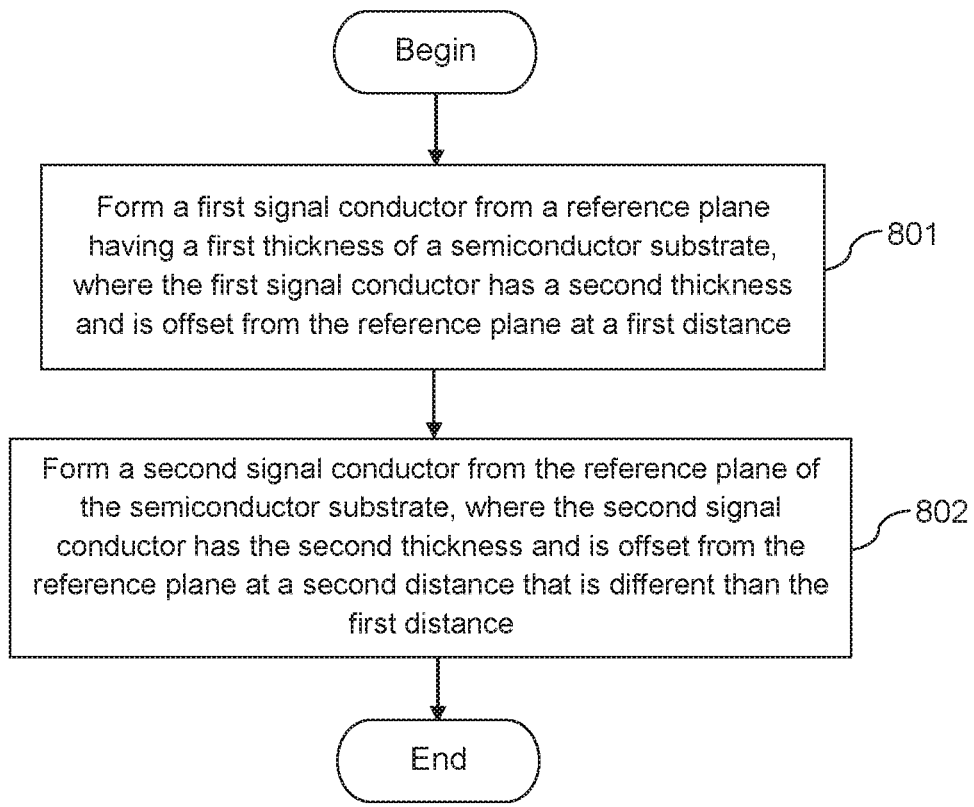
FIG. 8 shows a flowchart of illustrative steps for fabricating a passive equalization circuit on a semiconductor substrate in accordance with an embodiment.

FIG. 8 shows a flowchart of illustrative steps for fabricating a passive equalization circuit on a semiconductor substrate in accordance with one embodiment of the present invention. It should be appreciated that the embodiments of FIGS. 2, 3A, 3B, and 4 may be used as examples implemented by the steps described below.

At step 801, a first signal conductor is formed from a reference plane having a first thickness of the semiconductor substrate, where the first signal conductor has a second thickness and is offset from the reference plane at a first distance. As shown in FIGS. 2 and 4, signal conductor 210 of thickness T2 is formed and vertically offset a distance A1 from reference plane 202 of thickness T1. Distance A1 may be about, for example, 22 μm.

At step 802, a second signal conductor from the reference plane of the semiconductor substrate is formed. The second signal conductor has the second thickness and is offset from the reference plane at a second distance. As shown in FIG. 4, signal conductor 412 of thickness T5 may be formed and vertically offset a distance D from reference plane 202. For example, distance D may be about 46 μm. In one embodiment, thickness T2 and T5 may be smaller than thickness T1 by at least two times, five times, or ten times. For example, thickness T1 may be about 15 micrometer (μm), and thickness T2 and T5 may be about 2 μm. The thin nature of the first and second signal conductors may equalize the current distributions across the cross-section of the first and second signal conductors during high-frequency signal transmission, which may help mitigate skin-effect-induced dispersion problem.

Signal conductor 412 may also be horizontally offset a distance A2 from signal conductor 210 and a distance A3 from reference plane 204 in a second layer in semiconductor substrate 103. Distance A1, A2, and A3 may be equal or different from each other. For example, each distance A1, A2, and A3 may be about 22 μm. In one embodiment, signal conductors 210 and 412 are both a differential pair of signal conductors, which may carry differential signals from integrated circuit die 101 of FIG. 1. As shown in FIG. 4, signal conductor 412 may be horizontally offset a distance F from signal conductor 210 to maintain the differential pair density so as to support high bandwidth signal transmission. For instance, distance F may be about 8 μm.

The method and apparatuses described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A passive equalization structure comprising:
   a semiconductor substrate;
   a first signal conductor in a differential pair that is formed in a first layer in the semiconductor substrate;
   a second signal conductor in the differential pair that is formed in a second layer in the semiconductor substrate that is different than the first layer;
   first and second reference planes, wherein the first and second signal conductors are formed between the first and second reference planes; and
   a conductive via shorting the first and second reference planes.

2. The passive equalization structure defined in claim 1, wherein the first reference plane has a first thickness, and wherein the first signal conductor has a second thickness that is different than the first thickness.

3. The passive equalization structure defined in claim 2, wherein the second thickness is less than the first thickness.

4. The passive equalization structure defined in claim 2, wherein the second thickness is at least two times smaller than the first thickness.

5. The passive equalization structure defined in claim 2, wherein the second thickness is at least five times smaller than the first thickness.

6. An integrated circuit package comprising:
   a package substrate; and
   an integrated circuit mounted on the package substrate, wherein the package substrate includes a passive equalization structure that is coupled to the integrated circuit, and wherein the passive equalization structure comprises:
      a reference plane;
      a first signal conductor that is formed at a first distance from the reference plane; and
      a second signal conductor that is formed at a second distance from the reference plane, wherein the first and second distances are different, and wherein the first signal conductor and the reference plane have different thicknesses.

7. The integrated circuit package defined in claim 6, wherein the first and second signal conductors comprise a differential signal pair.

8. The integrated circuit package defined in claim 7, wherein the passive equalization structure further comprises an additional reference plane, and wherein the first and second signal conductors are interposed between the reference plane and the additional reference plane.

9. The integrated circuit package defined in claim 7, further comprising:
   dielectric material interposed between the reference plane and the first and second signal conductors.

10. The integrated circuit package defined in claim 6, wherein the thickness of the first signal conductor is less than the thickness of the reference plane.

11. A passive equalization circuit comprising:
    a substrate;
    a reference plane that has a first thickness and that is formed in the substrate; and
    a signal conductor that has a second thickness that is different than the first thickness and that is also formed in the substrate.

12. The passive equalization circuit defined in claim 11, wherein the second thickness of the signal conductor is less than the first thickness of the reference plane.

13. The passive equalization circuit defined in claim 12, further comprising:
    another signal conductor having the second thickness, wherein the signal conductor and the another signal conductor collectively serve as a differential signal pair.

14. The passive equalization circuit defined in claim 13, wherein the reference plane is formed in a first layer in the substrate, wherein the signal conductor is formed in a second layer in the substrate that is different than the first layer, and wherein the another signal conductor is formed in a third layer in the substrate that is different than the first and second layers.

15. The passive equalization circuit defined in claim 11, wherein the second thickness of the signal conductor is at least five times smaller than the first thickness of the reference plane.

16. The passive equalization circuit defined in claim 11, wherein the second thickness of the signal conductor is at least ten times smaller than the first thickness of the reference plane.

17. The passive equalization circuit defined in claim 11, wherein the reference plane comprises a power plane.

* * * * *